(12) United States Patent
Koh

(10) Patent No.: US 7,501,340 B2
(45) Date of Patent: Mar. 10, 2009

(54) METHODS OF FORMING INTERCONNECTION LINES IN SEMICONDUCTOR DEVICES

(75) Inventor: Kwan-Ju Koh, Incheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 426 days.

(21) Appl. No.: 11/317,759

(22) Filed: Dec. 23, 2005

(65) Prior Publication Data

US 2006/0141772 A1    Jun. 29, 2006

(30) Foreign Application Priority Data

Dec. 27, 2004   (KR) .................... 10-2004-0113146

(51) Int. Cl.
*H01L 21/4763* (2006.01)
(52) U.S. Cl. ................ 438/638; 257/E21.579
(58) Field of Classification Search ................ 438/675; 257/E21.579
See application file for complete search history.

(56) References Cited

U.S. PATENT DOCUMENTS 6,426,298 B1 * 7/2002 Chen et al. .................. 438/699

OTHER PUBLICATIONS

Chan, M.Y. et al., "Electrochemical Planarization by Selective Electroplating for Embedded Gold Wiring in the Sub-Micron Range" 1995 IEEE Region 10 International Conference on Microelectronics and VLSI, Nov. 6-10, 1995, pp. 287-290.*

* cited by examiner

*Primary Examiner*—Asok K Sarkar
(74) *Attorney, Agent, or Firm*—Andrew D. Fortney

(57) ABSTRACT

The present disclosure improves characteristics and reliability of a device by preventing seams within a copper layer, wherein seams are created when forming a copper line by a damascene process. Such seams created within a first and a second copper layer are prevented by a process in which the first copper layer and the second copper layer are deposited at constant speeds when the first copper layer is firstly formed only in a via hole by leaving a first copper seed layer only in the via hole, and then the second copper layer is formed in a trench by forming a second copper seed layer in the trench.

20 Claims, 6 Drawing Sheets

METHODS OF FORMING INTERCONNECTION LINES IN SEMICONDUCTOR DEVICES

TECHNICAL FIELD

The present disclosure relates to semiconductor devices and, more particularly, to methods of forming interconnection lines in semiconductor devices.

BACKGROUND

Generally, wiring technology refers to a technology for realizing interconnections, power supplying routes, and signal transmission routes of transistors in an integrated circuit (IC).

As design rules have been reduced due to the higher integration of semiconductor devices, memory cells have been stacked. Therefore, interconnection lines for electrically connecting between cells are formed in a multi-layer structure in order to freely perform wiring design and easily set resistance and current capacities of interconnection lines.

Conventionally, aluminum (Al) has been widely used as a line material. However, line resistance and contact resistance have been increased by decrease of line widths according to a trend of higher integration. Therefore, research on copper (Cu) lines is actively being undertaken for that reason and to cope with a problem of electromigration (EM). Copper has a lower resistivity than that of aluminum by about 62%, and copper has better strength against electromigration. Therefore, better reliability may be obtained from copper lines, especially for a semiconductor device of high integration and high speed.

In addition, an insulating layer having a low dielectric constant (low-k) of less than 3.0 is used for an insulating layer between interconnection lines in order to decrease a parasitic capacitance therein.

On the other hand, it is very difficult to pattern copper because copper is difficult to dry-etch in comparison with aluminum, and an insulating layer having a low-k has a drawback in that a gap-filling characteristic is poor.

Accordingly, a damascene process for simultaneously forming a contact and an interconnection line has recently been used to solve such a problem. The damascene process is carried out as follows. Firstly, an insulating layer having a low-k is formed, and then a damascene structure including a via hole and a line-shaped trench is formed. Next, the damascene structure is filled with a copper layer by electrolysis of a copper seed layer formed in the damascene structure. Finally, an overflowing portion of the copper layer is removed by chemical mechanical polishing (CMP).

In addition, a damascene structure is formed by performing one among a via-first, trench-first, or self-align scheme. The via-first scheme is a process to form a line-shaped trench on an upper part of a via hole after firstly forming a via hole by etching an insulating layer. On the other hand, the trench-first scheme is a process to firstly form a trench on an insulating layer before forming a via hole. The self-align scheme is a process to form a via hole and a trench simultaneously.

However, when an electroplating method is performed in order to fill a damascene structure with a copper layer after forming a copper seed layer as described above, seams in the copper layer may occur in an inner part of the damascene structure, particularly at a boundary region between the via hole and the trench, because the copper layer is deposited at a different speed according to an aspect ratio of the damascene structure.

Such seams deteriorate strength against electromigration. Moreover, such seams deteriorate characteristics and reliability of a device because they are opened during a CMP process so as to induce critical defects of a device.

The above information disclosed in this section is only for enhancement of understanding of the background of the disclosure and, therefore, it may contain information that does not form the prior art that is already known in this country to a person of ordinary skill in the art.

Figure 1A:
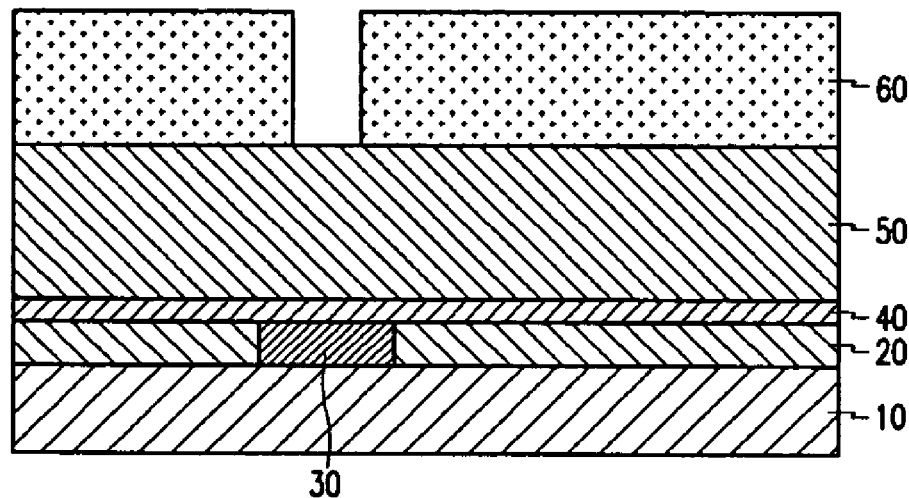
FIG. 1A to FIG. 1K are cross-sectional views showing sequential stages of a method of forming a disclosed copper interconnection line in a semiconductor device.

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Referring to FIG. 1A to FIG. 1K, a method of forming copper interconnection lines in semiconductor devices according to one example will be described.

Referring to FIG. 1A, a diffusion barrier layer 40 including silicon nitride (SiN) and a second interlayer insulating layer 50 are sequentially formed on a semiconductor substrate 10 including a first interlayer insulating layer 20 and a lower copper line 30. Here, the diffusion barrier layer 40 prevents copper in the lower copper line 30 from diffusing into the second interlayer insulating layer 50. In addition, the first interlayer insulating layer 20 and the second interlayer insulating layer 50 are formed as an insulating layer having a low dielectric constant (low-k) of less than 3.0. Subsequently, a first photoresist layer is coated on a surface of the second interlayer insulating layer 50, and a first photoresist pattern 60 is formed by exposing and developing the first photoresist layer through a photolithography process such that the second interlayer insulating layer 50 on the lower copper line 30 is exposed.

Figure 1B:
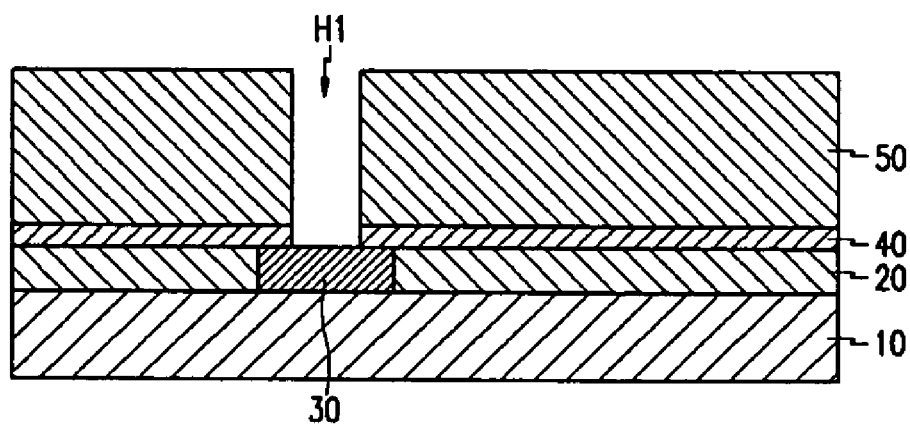

Referring to FIG. 1B, a via hole H1 to expose the lower copper line 30 is formed by etching the second interlayer insulating layer 50 and the diffusion barrier layer 40 using the first photoresist pattern 60 (refer to FIG. 1A) as a mask. Thereafter, the first photoresist pattern 60 is removed by a well-known method.

Figure 1C:
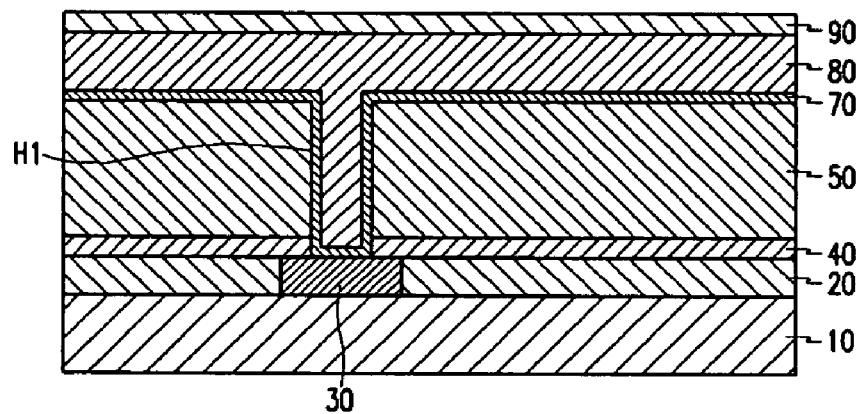

Referring to FIG. 1C, a first copper seed layer 70 is formed on the via hole H1 and a surface of the second interlayer insulating layer 50, and a second photoresist layer 80 is formed on an upper part of the first copper seed layer 70 in order to fill in the via hole H1. Subsequently, an internal layer 90 is formed on an upper part of the second photoresist layer 80 in order to separate the second photoresist layer 80 from a third photoresist layer (not shown) formed in subsequent processes. Here, the internal layer 90 is formed as an insulating layer, such as an oxide layer, nitride layer, etc., or a polysilicon layer.

Figure 1D:
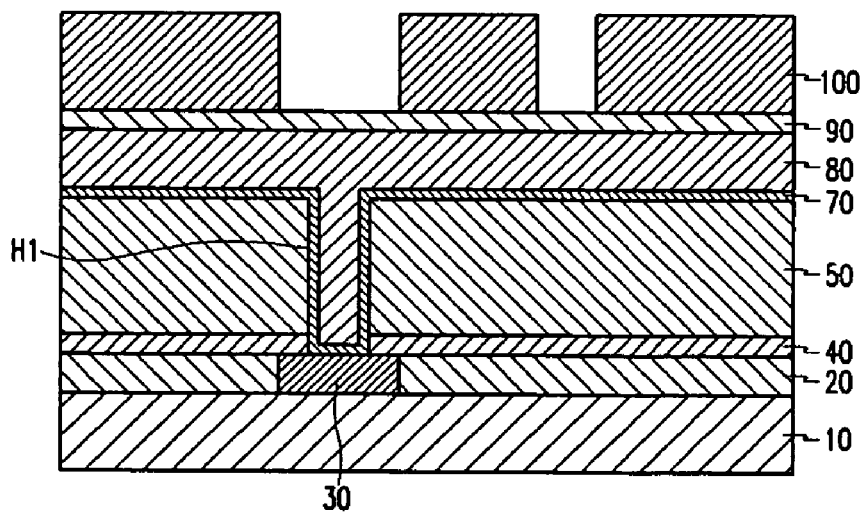

Referring to FIG. 1D, a third photoresist layer is coated on an upper part of the internal layer 90, and a third photoresist pattern 100 is formed by exposing and developing the third photoresist layer through a photolithography process such that the via hole H1 and the internal layer 90 around the via hole H1 are exposed.

Figure 1E:
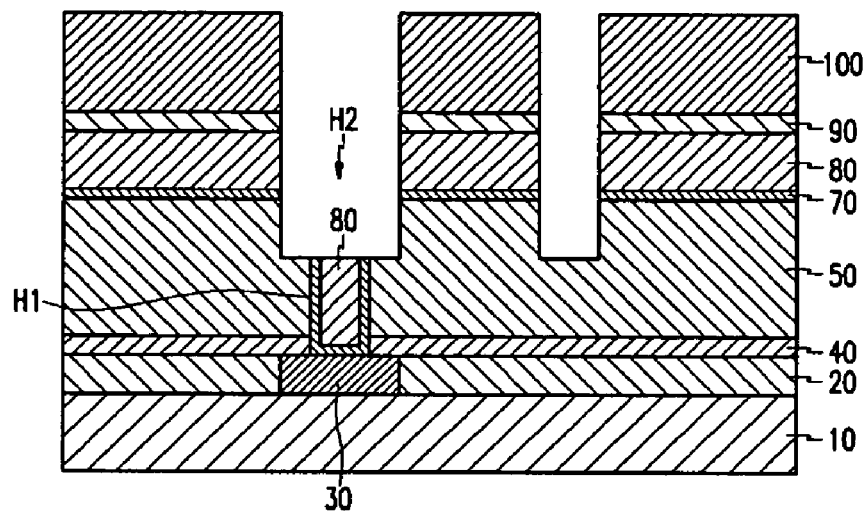

Referring to FIG. 1E, a line-shaped trench H2 is formed by etching the internal layer 90 using the third photoresist pattern 100 as a mask, and then by sequentially etching the second photoresist layer 80, the first copper seed layer 70, and an upper part of the second interlayer insulating layer 50 using the internal layer 90 and the third photoresist pattern 100 as a mask. Here, for the purpose of preventing damage in the via hole H1, such sequential etching is performed by an etching process having a similar etching speed with respect to the second photoresist layer 80 and the second interlayer insulating layer 50.

Figure 1F:
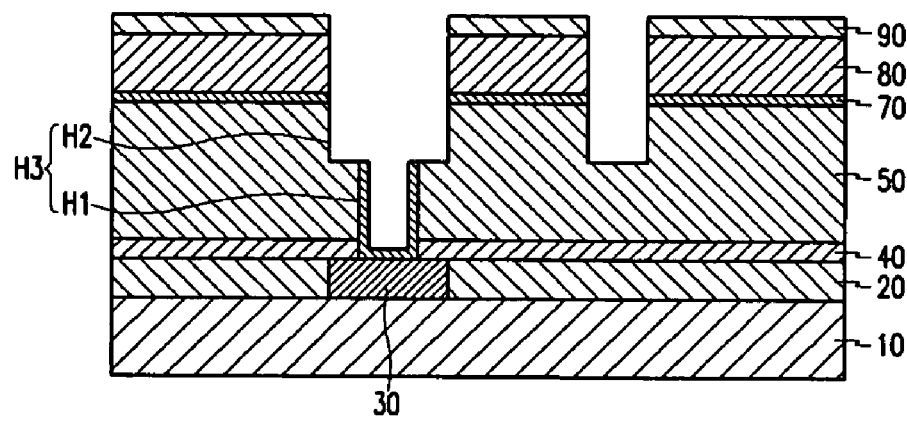

Referring to FIG. 1F, the third photoresist pattern 100 and the second photoresist layer 80 filling in the via hole H1 are removed by a well-known method so as to expose a first copper seed layer 70 in the via hole H1.

Consequently, a damascene structure H3 including the via hole H1 and the trench H2 is formed.

Figure 1G:
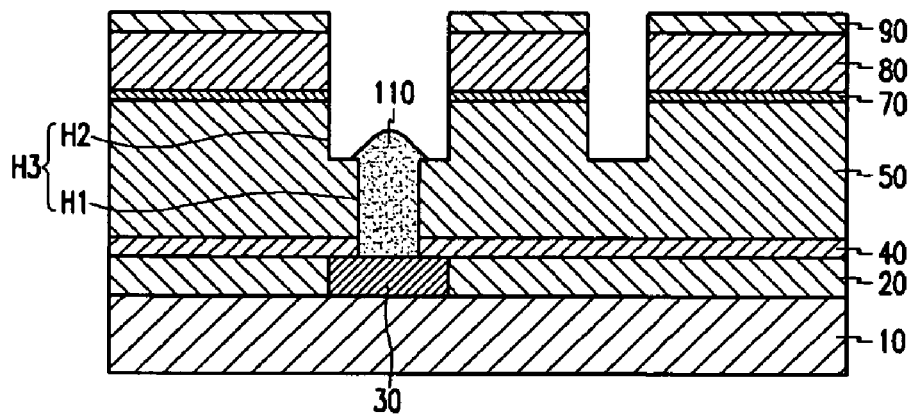
Figure 1H:
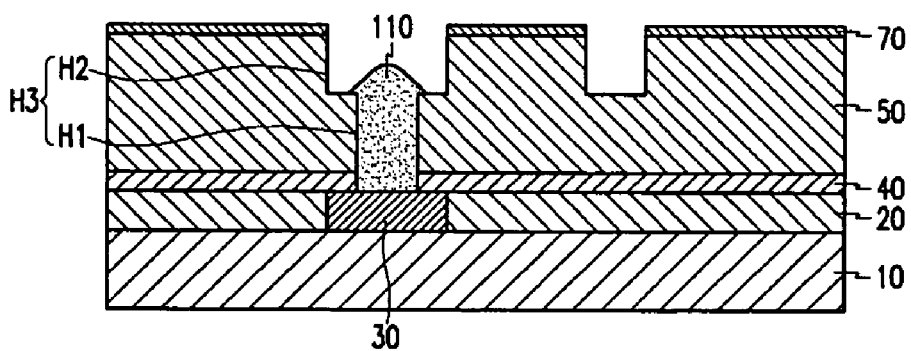

Referring to FIG. 1G, a first copper layer 110 to fill in the via hole H1 is formed in the via hole H1 by an electroplating method using the first copper seed layer 70 exposed in the via hole H1. Subsequently, as shown in FIG. 1H, the internal layer 90 and the second photoresist layer 80 are completely removed.

Figure 1I:
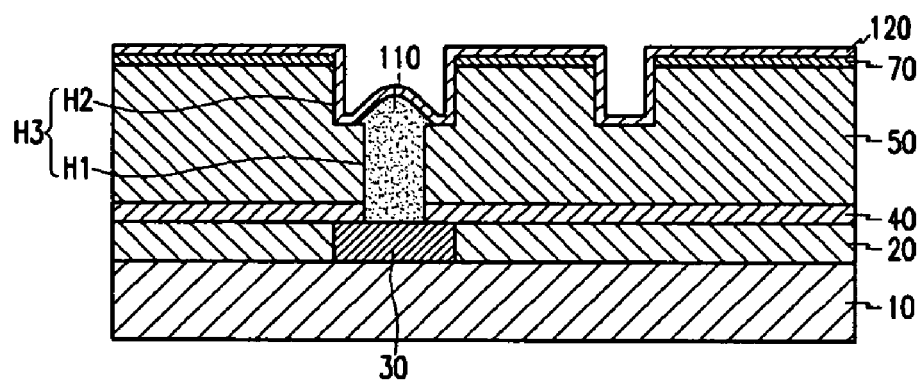
Figure 1J:
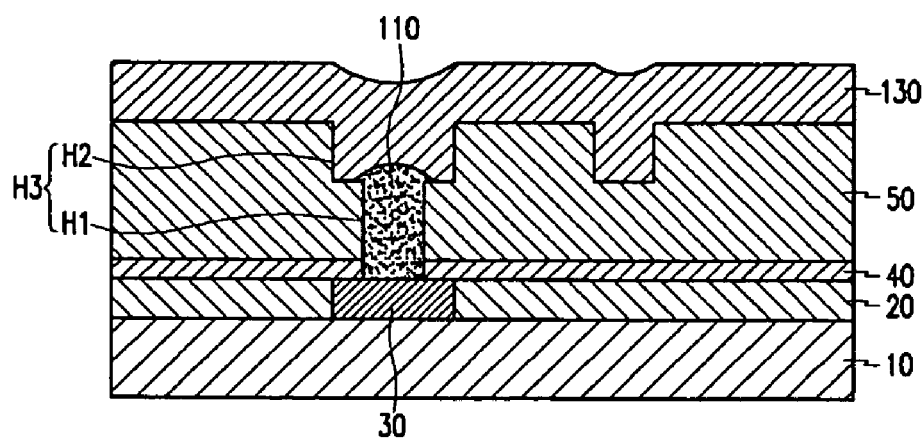

Referring to FIG. 1I, a second copper seed layer 120 is formed on the entire surface of the substrate 10, and, as shown in FIG. 1J, a second copper layer 130 to fill in the trench H2 is formed on the trench H2 and the second interlayer insulating layer 50 by an electroplating method using the second copper seed layer 120.

Figure 1K:
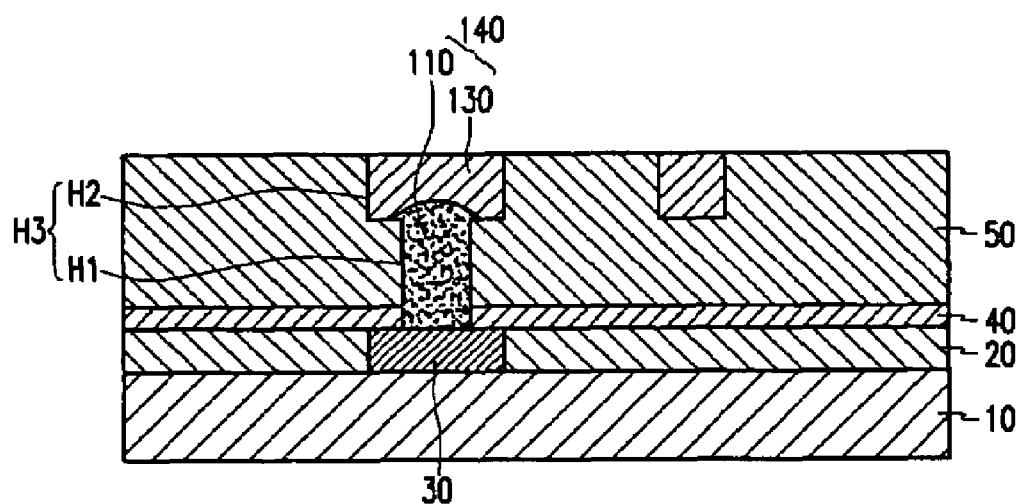

Referring to FIG. 1K, an upper copper line 140 including the first copper layer 110 and the second copper layer 130 is formed by removing the second copper layer 130 through a chemical mechanical polishing (CMP) process to a degree that the second interlayer insulating layer 50 is exposed.

That is, when the first copper layer 110 is firstly formed only in the via hole H1 by leaving the first copper seed layer 70 only in the via hole H1, and then the second copper layer 130 is formed in the trench H2 by forming the second copper seed layer 70 in the trench H2, the first copper layer 110 and the second copper layer 130 are deposited at constant speeds because a deposit speed of a copper layer is constant under a constant aspect ratio of a hole.

Therefore, seams are not created in an inner part of the first copper layer 110 and the second copper layer 130.

As disclosed herein, a copper line is formed by forming each copper layer at a constant deposit speed in a via hole and a trench of a damascene structure, and then by performing a CMP process. Therefore, since seams and openings in a copper layer can be prevented, strength of a copper line against electromigration (EM) may be improved and occurrences of defects may be minimized. Consequently, characteristics and reliabilities of semiconductor devices may be improved.

As disclosed herein, an example method of forming an interconnection line in a semiconductor device has advantages of improving characteristics and reliability of a device by preventing seams within a copper layer, wherein such seams are created when forming a copper line by a damascene process.

One example disclosed method forming an interconnection line includes: forming an interlayer insulating layer in a semiconductor substrate; forming a via hole to partially expose the substrate by etching the interlayer insulating layer; forming a first copper seed layer on the via hole and a surface of the interlayer insulating layer; forming a photoresist layer on the first copper seed layer in order to fill in the via hole; forming a line-shaped trench having the via hole on an upper part of the via hole by sequentially etching the photoresist layer, the first copper seed layer, and an upper part of the interlayer insulating layer; forming a damascene structure including the via hole and the trench by removing a photoresist layer filling in the via hole to a degree that a first copper seed layer in the via hole is exposed; forming a first copper layer only in the via hole using the exposed first copper seed layer; removing the photoresist layer completely; forming a second copper seed layer on the entire surface of the substrate; and forming a second copper layer on the interlayer insulating layer and the trench using the second copper seed layer.

In one such example, forming of the trench may include: forming an internal layer on the photoresist layer; forming a photoresist pattern in the internal layer to expose the via hole and the internal layer around the via hole; etching the internal layer using the photoresist pattern as a mask; sequentially etching the photoresist layer, the first copper seed layer, and the upper part of the interlayer insulating layer using the internal layer and the photoresist pattern as a mask; and sequentially removing the photoresist pattern and the internal layer.

In addition, the internal layer may include an insulating layer or a polysilicon layer, and the insulating layer may be composed of oxides or nitrides.

In addition, the photoresist layer filling in the via hole may be removed while removing the photoresist pattern.

This patent application makes reference to, incorporates the same herein, and claims all benefits accruing under 35 U.S.C. § 119 from Korean Patent Application No. 10-2004-0113146 filed in the Korean Intellectual Property Office on Dec. 27, 2004.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of forming an interconnection line in a semiconductor device, comprising:

forming an insulating layer on a semiconductor substrate;

forming a via hole to partially expose the semiconductor substrate by etching the insulating layer;

forming a first copper seed layer on the via hole and a surface of the insulating layer;

forming a first photoresist layer on the first copper seed layer, the first photoresist layer filling the via hole;

forming a line-shaped trench over the first photoresist layer in the via hole by sequentially etching the first photoresist layer, a portion of the first copper seed layer, and an upper part of the insulating layer;

forming a damascene structure including the via hole and the trench by removing the first photoresist layer in the via hole to expose the first copper seed layer in the via hole;

forming a first copper layer that fills the via hole and has a top portion protruding into a bottom portion of the trench on the exposed first copper seed layer;

removing a remaining portion of the first photoresist layer on the insulating layer;

forming a second copper seed layer on an entire surface of the substrate; and forming a second copper layer on the insulating layer and in the trench using the second copper seed layer.

2. The method of claim 1, wherein the forming of the trench comprises:

forming an internal layer on the first photoresist layer;

forming a second photoresist pattern on the internal layer to expose the via hole and the internal layer around the via hole;

etching the internal layer using the second photoresist pattern as a mask;

sequentially etching the first photoresist layer, the first copper seed layer, and an upper part of the insulating layer using the internal layer and the second photoresist pattern as a mask; and sequentially removing the second photoresist pattern and the internal layer.

3. The method of claim 2, wherein the internal layer comprises an insulating layer or a polysilicon layer.

4. The method of claim 3, wherein the insulating layer comprises an oxide or a nitride.

5. The method of claim 2, wherein the first photoresist layer in the via hole is removed while removing the second photoresist pattern.

6. The method of claim 1, wherein the first copper layer is deposited at a first substantially constant deposit speed.

7. The method of claim 6, wherein the second copper layer is deposited at a second substantially constant deposit speed.

8. The method of claim 1, wherein the insulating layer comprises a low K dielectric material.

9. The method of claim 1, wherein the insulating layer has a dielectric constant of less than about 3.0.

10. The method of claim 1, wherein the insulating layer comprises an oxide layer or a nitride layer.

11. The method of claim 1, wherein forming the first copper seed layer comprises electroplating.

12. The method of claim 1, wherein forming the second copper layer comprises electroplating.

13. The method of claim 1, wherein the step of removing the first photoresist layer comprises dry etching the first photoresist layer.

14. The method of claim 3, wherein the insulating layer comprises a polyimide, an organic polymer, an inorganic polymer, silicon oxide, silicon nitride, a spin-on-glass material or a combination Thereof.

15. The method of claim 1, further comprising removing the second copper layer by chemical mechanical polishing to expose the insulating layer and form an upper copper line.

16. The method of claim 1, further comprising forming a lower copper line on the semiconductor substrate prior to forming the insulating layer.

17. The method of claim 16, wherein the via, hole exposes the lower copper line.

18. The method of claim 1, wherein the trench is wider than the via hole.

19. The method of claim 1, further comprising forming a diffusion barrier layer on the semiconductor substrate prior to forming the insulating layer.

20. The method of claim 19, wherein the diffusion barrier layer comprises silicon nitride.

* * * * *